(12) United States Patent
Townsend et al.

(10) Patent No.: US 6,606,388 B1
(45) Date of Patent: Aug. 12, 2003

(54) METHOD AND SYSTEM FOR ENHANCING AUDIO SIGNALS

(75) Inventors: Chris Townsend, Oakland, CA (US); Aram Lindahl, Palo Alto, CA (US)

(73) Assignee: Arboretum Systems, Inc., Irvine, CA (US)

( * ) Notice: Subject to any disclaimer, the term of this patent is extended or adjusted under 35 U.S.C. 154(b) by 0 days.

(21) Appl. No.: 09/506,417

(22) Filed: Feb. 17, 2000

(Under 37 CFR 1.47)

(51) Int. Cl.[7] .......................... H04R 5/00; H03G 3/00; G10H 1/08
(52) U.S. Cl. ...................... 381/17; 381/18; 381/99; 381/1; 381/61; 84/625
(58) Field of Search .................. 381/1, 61, 63, 381/98, 99, 17, 18; 84/625, 660

(56) References Cited

U.S. PATENT DOCUMENTS

| | | | | |
|---|---|---|---|---|
| 5,230,022 A | * | 7/1993 | Sakata .......................... | 381/97 |
| 5,724,429 A | * | 3/1998 | Banerjea ....................... | 381/1 |
| 6,081,602 A | * | 6/2000 | Meyer et al. ................. | 381/182 |
| 6,285,767 B1 | * | 9/2001 | Klayman ...................... | 381/17 |
| 6,335,973 B1 | * | 1/2002 | Case ............................ | 381/61 |

* cited by examiner

*Primary Examiner*—Minsun Oh Harvey
*Assistant Examiner*—Laura A. Grier
(74) *Attorney, Agent, or Firm*—Joe Zheng; C. P. Chang; Pacific Law Group, LLP

(57) ABSTRACT

A technique for enhancing audio signals generated from compressed digital audio files is described. The technique uses a Bass Maximizer module, a Harmonic Exciter module and a Quasi Stereo module. The Bass Exciter module enhances the intensity, depth and punch of the bass audio content by creating harmonic sequences from low frequency components contained in the original input signal. The Harmonic Exciter module adds to the treble audio content of the original input signal by generating harmonic series from the high frequency components contained in the input signal. The Quasi Stereo Module creates a stereo image of the enhanced input signal by adding and subtracting delayed and filtered versions of the enhanced input signal with itself to create left and right channeled stereo-like outputs. The technique provides a useful tool to regenerate from an audio signal more pleasant and joyful sounds.

26 Claims, 5 Drawing Sheets

METHOD AND SYSTEM FOR ENHANCING AUDIO SIGNALS

BACKGROUND OF THE INVENTION

1. Field of the Invention

The present invention generally relates to the area of audio enhancement technology in personal computers, and more particularly to a method and system for processing audio signals for the purpose of perceptually improving the quality and characteristics of the audio signal to the satisfaction and enjoyment of listeners.

2. Description of the Related Art

The transfer of digital audio files to terminal devices through the Internet, wired or wireless networks has gained substantially in popularity in recent years. This increase is due in part to the availability of transportable compressed file formats that may be used to regenerate relatively high quality output audio signals from the compressed file formats received or stored at the terminal devices (e.g., multimedia computers and handheld digital audio players).

Digital audio signals typically consist of 16-bit samples recorded at a sampling rate more than twice the actual audio bandwidth (e.g., 44.1 kHz for compact discs). For example, given 16-bit samples at a sampling frequency of 44.1 kHz, without the compressed file formats, one minute of mono audio would require 5.1 Mbytes of memory and one minute of stereo audio would require 10 Mbytes of memory. A typical compact disc containing digital audio information has an approximate storage capacity of 783 Mbytes which would, for example, provide 74 minutes and 33 seconds of stereo music. However, it would take over 30 hours to download an uncompressed album length audio file of this type using a 56 K modem.

Using a standard audio compression methodology such as MPEG Audio Layer 3 (MP3), a CD quality sound file may have the same amount of data but compressed by a factor of 12 for efficient transmission to the terminal devices. The reduction of data reduces the download time considerably over standard network connections (i.e., the Internet), which makes it possible now to transfer digital audio files over a network. But the reduction of data is achieved by minimizing "redundant information" in the data. In fact, some data reduction processes have introduced undesirable side effects that degrade the original quality of the sound. Specifically, some of the data reduction encoding methods currently used degrade the bass and high frequency ends of the audio spectrum and add audible artifacts which are particularly noticeable on low quality sound delivery systems such as those low-priced audio systems for a multimedia personal computer.

Additionally, many digital audio files are generated from analog sources that are often monaural and lacking depth in the low and high frequency ends of the audible spectrum due to the particular recording methodology used. These recordings lack the perceptual characters and dynamics of the original audio signal and quite often contain an inordinate amount of audible artifacts.

There is therefore a need for a solution that will enable any digital audio reproduction devices to enhance the low and high frequency ends (i.e., bass and treble) of the output signal resulting from stored digital audio files, to remove audible artifacts resulting from the compression or recording processes and to generate stereo images to enhance monaural digital audio files so that users or listeners can enjoy the processed sound to a great extent.

SUMMARY OF THE INVENTION

According to the principles of the present invention, an input signal is passed through three processing modules; a Bass Maximizer module, a Harmonic Exciter module and a Quasi Stereo module. The Bass Exciter module enhances the intensity, depth and punch of the bass audio content by creating harmonic sequences from low frequency components contained in the original input signal. The Harmonic Exciter module adds to the treble audio content of the original input signal by generating harmonic series from the high frequency components contained in the input signal. The Quasi Stereo Module creates a stereo image of the enhanced input signal by adding and subtracting delayed and filtered versions of the enhanced input signal with itself to create left and right channeled stereo-like outputs.

The present invention may be implemented as a method, an apparatus or in a computer readable medium. The advantages of the invention are numerous. Different embodiments or implementations may yield one or more of the following advantages. One advantage of the invention is that it facilitates separate modification and enhancement of the low end frequency components (bass) and the high end frequency components (treble) in digital audio files. Another advantage of the invention is that it facilitates the generation of high quality stereo images from monaural input signals. Still another advantage of the present invention is that it processes audio files in real time with minimal utilization of the processing system's resources.

Other objects, together with the foregoing are attained in the exercise of the invention in the following description and resulting in the embodiment illustrated in the accompanying drawings.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to a method and system for enhancing the output generated from digital audio files, and more particularly to a method and system for adding bass and treble to input signals and generating a stereo output signal from the enhanced input signals, wherein the input signals include either mono or stereo sounds.

The present invention can be used in digital audio players that include but are not limited to computing devices and audio players with solid state memories (i.e., RIO™ Players), digital tape players, digital radios and similar types of devices with a software plug-in implementing some or all of the processes in the present invention.

Notation and Nomenclature

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention.

The detailed description of the present invention in the following are presented largely in terms of procedures, steps, logic blocks, processing, and other symbolic representations that resemble of data processing devices capable of reproducing audio signals. These process descriptions and representations are the means used by those experienced or skilled in the art to most effectively convey the substance of their work to others skilled in the art. The method along with the apparatus to be described in detail below is a self-consistent sequence of processes or steps leading to a desired result. These steps or processes are those requiring physical manipulations of physical quantities. Usually, though not necessarily, these quantities may take the form of electrical signals capable of being stored, transferred, combined, compared, displayed and otherwise manipulated in a computer system or electronic computing devices. It proves convenient at times, principally for reasons of common usage, to refer to these signals as bits, values, elements, symbols, operations, messages, terms, numbers, or the like. It should be borne in mind that all of these similar terms are to be associated with the appropriate physical quantities and are merely convenient labels applied to these quantities. Unless specifically stated otherwise as apparent from the following description, it is appreciated that throughout the present invention, discussions utilizing terms such as "processing" or "computing" or "verifying" or "displaying" or the like, refer to the actions and processes of a computing device that manipulates and transforms data represented as physical quantities within the device's registers and memories into analog output signals via resident transducers.

The Preferred Embodiment

Figure 1A:
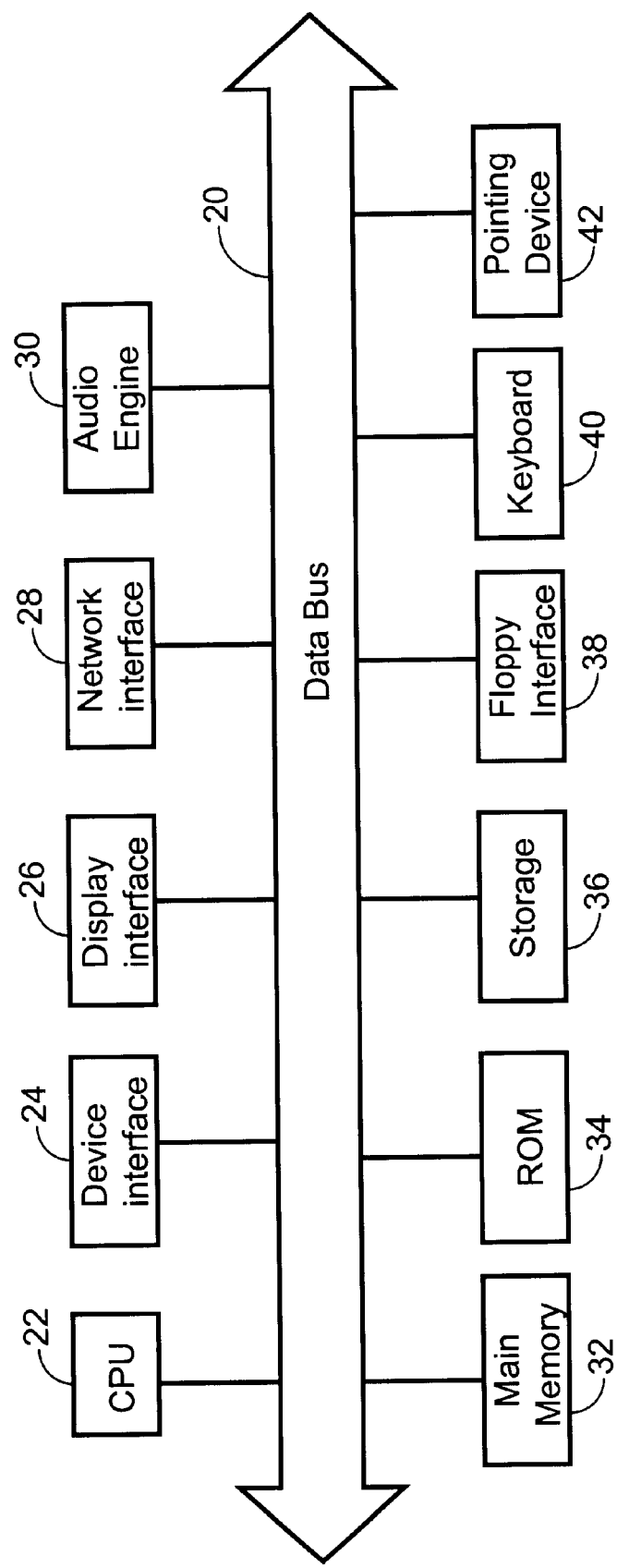
FIG. 1A shows a block diagram of a preferred internal construction of a computing system in which the present invention may be practiced.

Referring now to the drawings, in which like numerals refer to like parts throughout the several views. FIG. 1A shows a block diagram showing a preferred internal construction of a computing system in which the present invention may be practiced. The computing system illustrated in the figure may not be necessarily so configured with every component therein and provide enhanced audio sounds by employing the present invention with at least some of the components. In one embodiment, the computing system is a personal computer and includes a central processing unit (CPU) 22 interfaced to a data bus 20 and a device interface 24. CPU 22 executes certain instructions to manage all devices and interfaces coupled to data bus 20 for synchronized operations. Device interface 24 may be coupled to an external device such as a audio recording device hence audio data therefrom are received into a memory or storage through data bus 20. Also interfaced to data bus 20 is a display interface 26, network interface 28, audio engine 30 and floppy disk drive interface 38. Generally, a compiled and linked version of one embodiment of the present invention is loaded into storage 36 through floppy disk drive interface 38, network interface 28, device interface 24 or other interfaces coupled to data bus 20. Audio engine 30 implementing a digital audio enhancement system to be described in detail below may be a sound card or a secondary processor such as a digital signal processor or a software plug-in. In another embodiment, audio engine 30 may be used alone in a portable audio player to regenerate quality audio signals from compressed audio files.

Generally, main memory 32 such as random access memory (RAM) is interfaced to data bus 20 to provide CPU 22 with the instructions and access to memory storage 36 for data and other instructions. In particular, when executing stored application program instructions, such as the complied and linked version of the present invention, CPU 22 is caused to manipulate the audio data to achieve desired results. ROM (read only memory) 34 is provided for storing invariant instruction sequences such as a basic input/output operation system (BIOS) for operation of keyboard 40, display 26 and pointing device 42 if there are any.

Figure 1B:
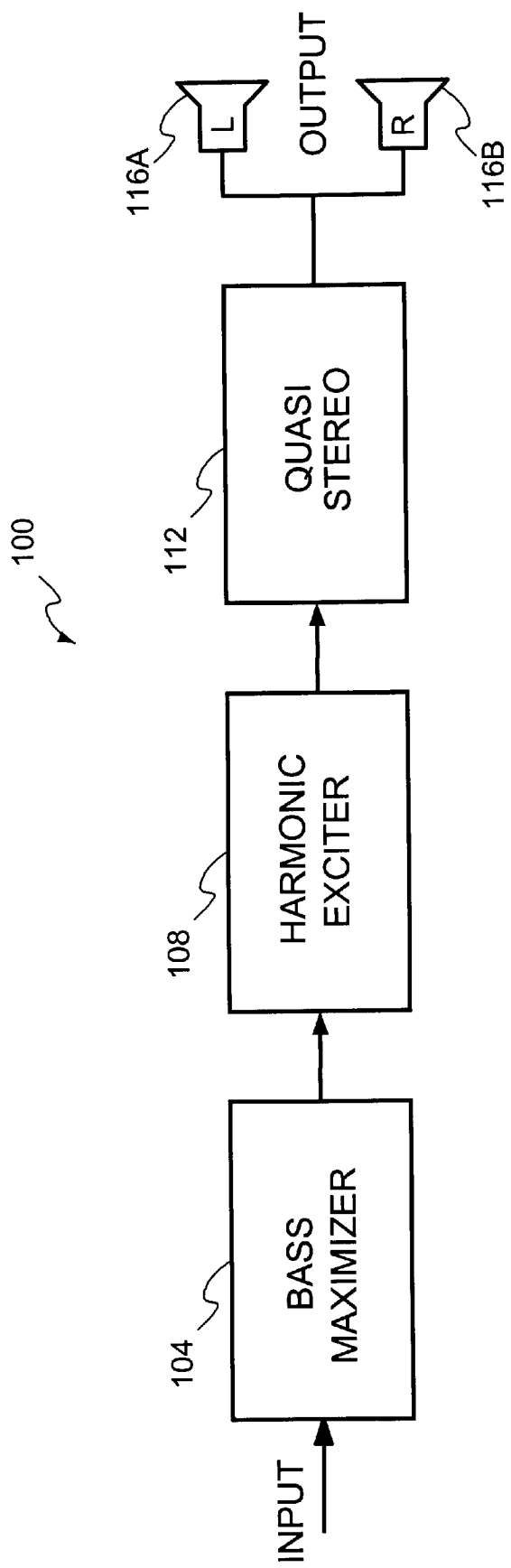
FIG. 1B is a functional block diagram showing a digital audio enhancement system according to a preferred embodiment of the present invention.

Referring now to FIG. 1B, there is a block diagram of digital audio enhancement system 100 embodying the present invention. Digital audio enhancement system 100 comprises a Bass Maximizer module 104, a Harmonic Exciter module 108 and a Quasi-Stereo module 112. All three modules may be implemented with hardware components, software modules or a combination of the two. As indicated above, the operations of these principle components are controlled by a processing unit, e.g., a CPU or a DSP executing stored program instruction code. The operation and function of each of the principle components is described below.

Figure 2:
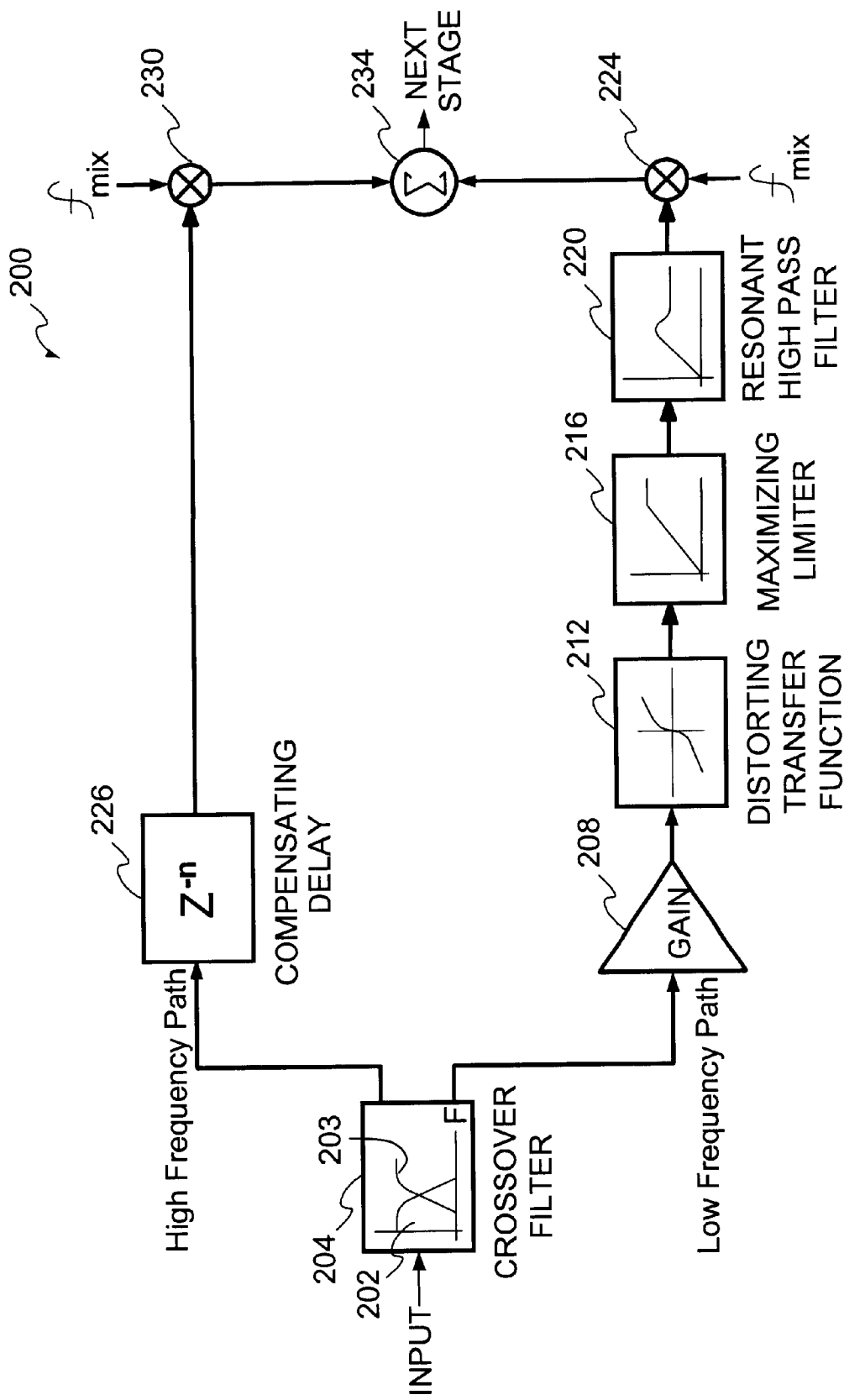
FIG. 2 is a functional block diagram showing the principle components of the Bass Maximizer module according to a preferred embodiment of the present invention.

Referring now to FIG. 2, Bass Maximizer module 200 (corresponding to Bass Maximizer module 104 of FIG. 1) enhances the intensity, depth and punch of the low frequency components contained in the original input signal. The process begins by dividing an input signal into low and high frequency signal components 202 and 203 (from the prospective in a frequency domain) by passing the input signal through a phase compensated crossover filter 204. The function of phase compensated crossover filter 204 helps to ensure that when the low and high frequency components 202 and 203 are recombined, they remain lined up in the time domain. A gain circuit 208 amplifies the low frequency components prior to further processing. The amplified low frequency components then have a variable distortion transfer function applied at 212. The variable distortion transfer function provides an optimized mix of the even and odd harmonics of the amplified low frequency components resulting from the original input signal. A combination of even and odd components yields a smoother, rounder bass while odd harmonics alone yield a sharper bass. The harmonically distorted and amplified low frequency components are then passed through a maximizing limiter 216 which is designed to increase the amplitude of the enhanced signal and slow down the bass signal decay rates.

The output of the maximizing limiter is then passed through a second order resonant high pass filter 220 which is designed to position the resonant peak of the signal at a particular frequency, increase the bass effect and reduce the amplitude of sub-harmonic audio artifacts. With digital filters of this type, each sample is processed through a transfer function to affect a change in the frequency response or phase of the signal. The specific operation of this filter may be described by a series of linear shift-invariant difference equations that define the behavior of the signal in the time domain. The output of the second order resonant high pass filter 220 is then passed through a mixer 224 which adds unaltered frequency components from the original signal prior to signal restoration.

The high frequency components, which are separated by phase compensated crossover filter 204, are passed through compensating delay 226 which may be realized with shift registers or memory locations. Compensating delay 226 functions to add a small delay to the high frequency components to further insure that low and high frequency components remain aligned with respect to the time domain. The output of compensating delay 226 is then passed through a mixer 230 which adds unaltered frequency components prior to signal restoration. The high and low frequency components are formed into an enhanced signal by an adding circuit or summer 234 and passed to the Harmonic Exciter module.

Figure 3:
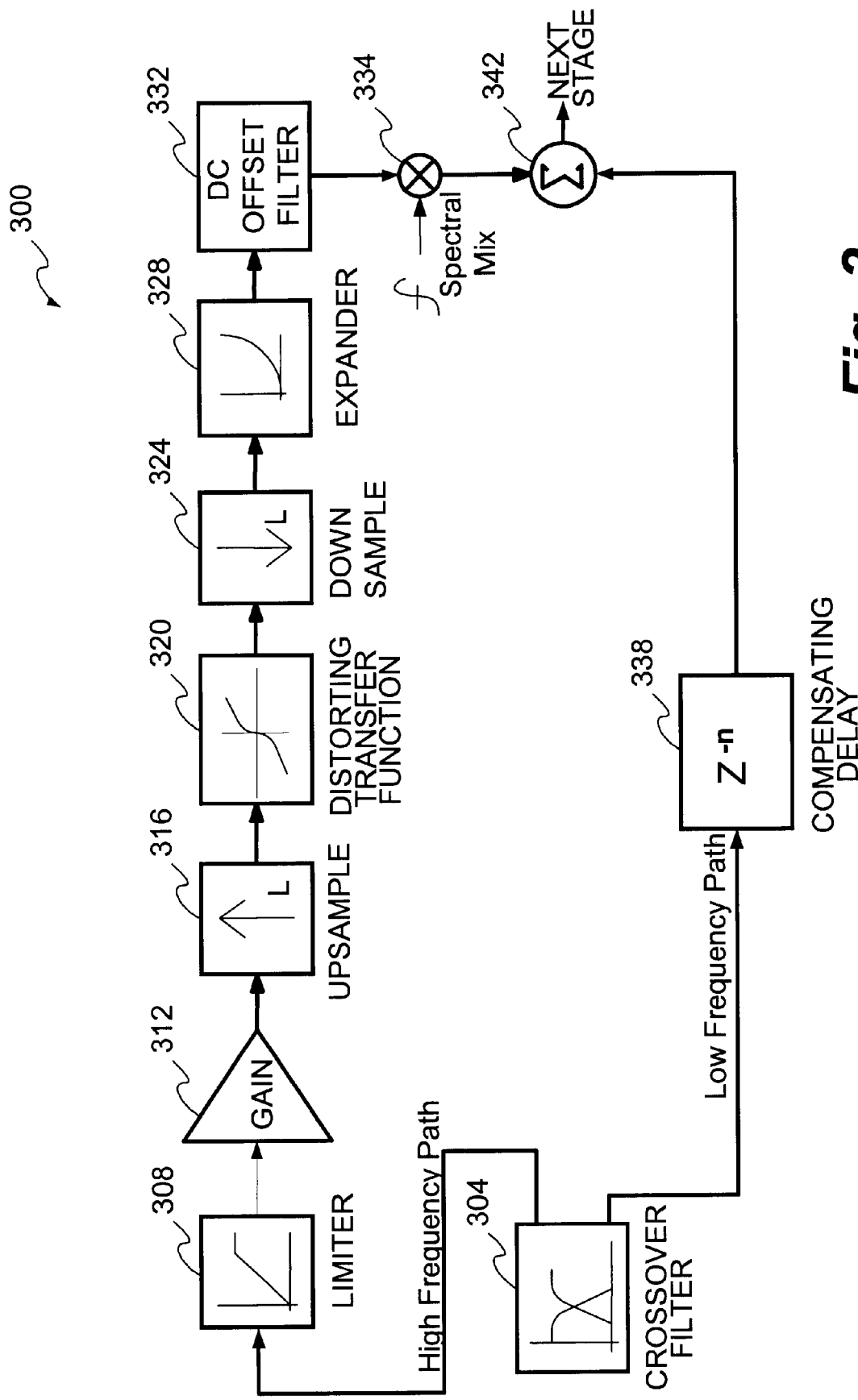
FIG. 3 is a functional block diagram showing the principle components of the Harmonic Exciter module according to a preferred embodiment of the present invention.

Referring now to FIG. 3, Harmonics Exciter module 300 (corresponding to Harmonic Exciter module 108 of FIG. 1) adds brilliance and detail to the treble audio content of the bass enhanced input signal received from Bass Maximizer module (200 of FIG. 1). This task is accomplished by generating harmonic series from the high frequency components contained within the enhanced signal.

The process begins by separating the high and low frequency components using a phase compensated crossover filter 304 that may be the same type in FIG. 2. The separated high frequency components are passed through limiter 308 which functions to compress dynamic frequency range. The band limited high frequency components are then passed through gain circuit 312. The amplified band limited high frequency components are used to generate harmonic series that significantly contribute to the treble components of the output signal. The amplified band limited high frequency components are then passed through a processing stage comprising a distorting transfer function 320 sandwiched between an upsampling function 316 and a downsampling function 324. The variable distortion transfer function 320 provides an optimized mix of the even and odd harmonics that function to enhance the band limited high frequency components. A combination of even and odd components yields a warmer sound while odd harmonics alone yield brighter treble. The upsampling and downsampling processes are performed for the purpose of eliminating aliasing. The processed output of this stage is passed through an expander 328. The expander 328 functions to improve the clarity of the treble range. The output of expander 328 is passed through a DC offset filter to remove non-symmetrical artifacts resulting from distortion transfer function processing. The spectral mixer 334 allows a user to customize the output of the Harmonic Exciter module by mixing the enhanced high frequency components with unaltered low frequency components.

The low frequency components, which are separated by phase compensated crossover filter 304, are passed through compensating delay 338 which may be realized with shift registers or memory locations. Compensating delay 338 functions to add a small delay to the low frequency components to further insure that low and high frequency components remain aligned with respect to the time domain. The high and low frequency components are formed into a bass and treble enhanced signal by summer 342 and passed to the Quasi Stereo module.

Figure 4:
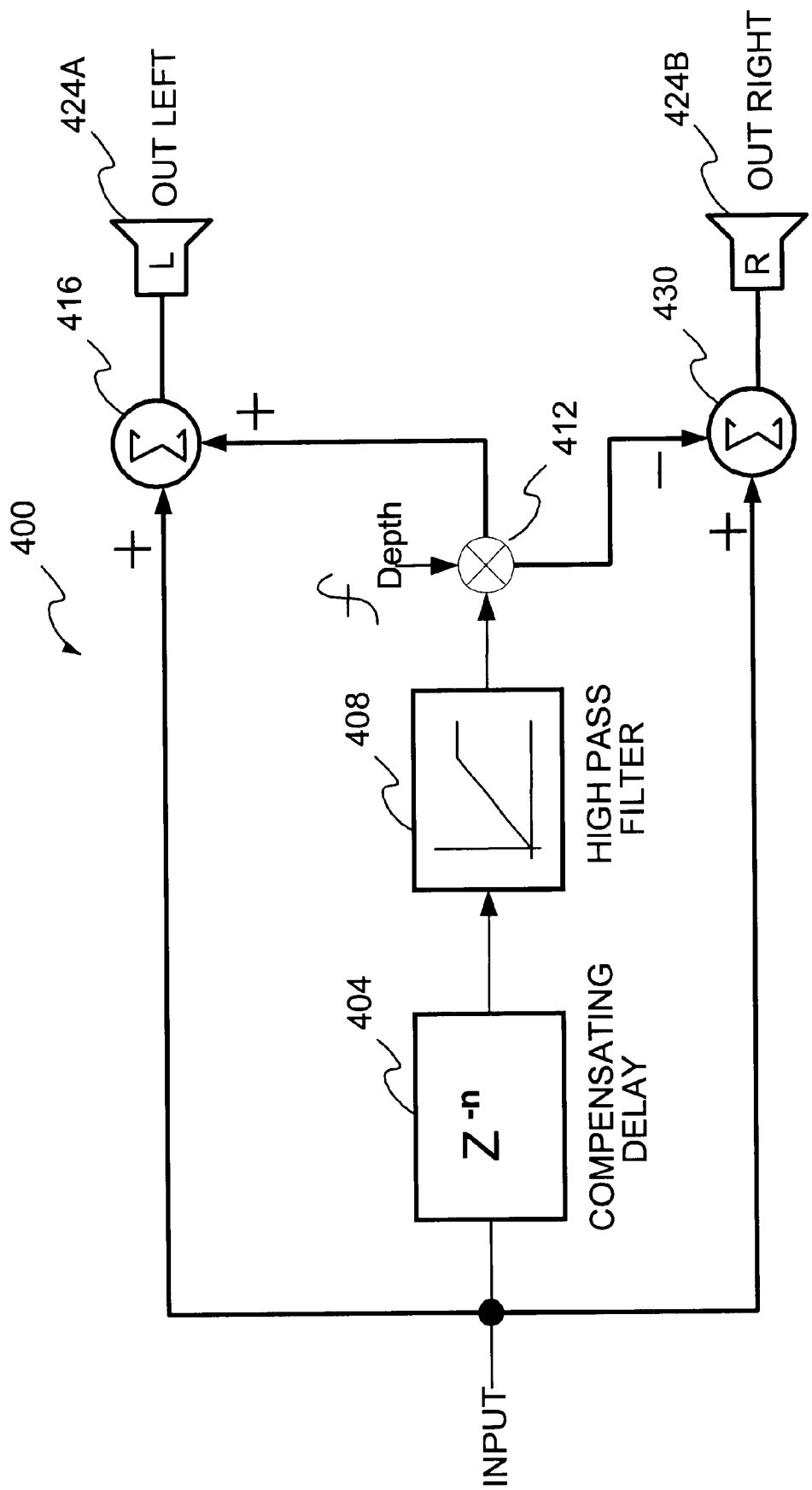
FIG. 4 is a functional block diagram showing the principle components of the Quasi Stereo module according to a preferred embodiment of the present invention.

Quasi-Stereo module 400 shown in FIG. 4 corresponding to Quasi-Stereo module 112 of FIG. 1 generates a stereo image of the input signal and/or enhances the width of an existing stereo image. This task is accomplished by adding and subtracting a delayed and filtered version of the bass and treble enhanced monaural signal. The input through a compensating delay stage 404 having a delay generally in the range of 2 to 20 milliseconds. The delayed signal is then filtered by high pass filter 408. The output of high pass filter 408 is passed to a depth control mixer that facilitates alterations of the perceptual characteristics of the stereo image. The delayed and filtered signal is then added to and subtracted, respectively, from the enhanced input signal to generate left and right output channels with stereo-like output channels.

The description above has made it evident it those skilled in the art the exact implementation of each component in FIGS. 2, 3 and 4. Some of the components are illustrated as a transfer function that is clearly understood by those skilled in the art. These components can be implemented by discrete and/or integrated circuits, and alternatively, the data processing logic in these components can be achieved in hardware and/or software.

The forgoing description of the preferred embodiment of the invention has been presented for the purposes of illustration and description. It is not intended to be exhaustive or to limit the invention to the precise form disclosed. Numerous modifications and variations are possible in light of the above teaching. For example, the order of the Bass maximizer and harmonic exciter may be different from what is described above.

The invention has been described in conjunction with the processing of digital audio files by devices having central processing units. It would be obvious to and understood by those having ordinary skill in the art that the present invention would be equally applicable to architectures where the digital audio files are processed by one or more digital signal processing (DSP) chips or other application specific integrated circuits (ASIC).

The advantages of the invention are numerous. Different embodiments or implementations may yield one or more of the following advantages. One advantage of the invention is that it facilitates the modification and enhancement of the low end frequency components (bass) and the high end frequency components (treble) processed digital audio files. Another advantage of the invention is that it facilitates the generation of high quality stereo images from monaural input signals. Still another advantage of the present invention is that it processes audio files in real time with minimal utilization of the processing system's resources.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be considered to fall within the scope of the invention. Accordingly, the scope of the present invention is defined by the appended claims rather than the forgoing description of embodiments.

We claim:

1. A method for enhancing the quality of an audio signal, the method comprising:

separating said audio signal into a first signal having low frequency components of said audio signal and a second signal having high frequency components of said audio signal;

processing said first signal, while delaying said second signal by a first amount of time taken for said processing of said first signal to finish, to enhance first characteristics of said first signal such that said first signal after processing can still be aligned temporally with the said second signal;

and processing delayed said second signal while delaying processed said first signal by a second amount of time taken for said processing of delayed said second signal to finish, to enhance second characteristics of delayed said second signal such that delayed said second signal after processing can be aligned temporally with processed said first signal; or processing said delayed second signal, while delaying said first signal by a second amount of time taken for said processing of said second signal to finish, to enhance second characteristics of said second signal such that said second signal after processing can still be aligned temporally with the said first signal;

and processing delayed said first signal while delaying processed said second signal by a first amount of time taken for said processing of delayed said first signal to finish, to enhance first characteristics of delayed said first signal such that delayed said first signal after processing can be aligned temporally with processed said second signal;

combining processed and delayed said delayed first signal and processed and delayed said second signal to form a processed audio signal; and generating a left-channel audio signal and a right-channel audio signal from said processed audio signal, wherein said left-channel audio signal is generated by adding a delayed and filtered version of said processed audio signal to said processed audio signal, said right-channel audio signal is generated by subtracting a delayed and filtered version of said processed audio signal from said processed audio signal.

2. The method as recited in claim 1, wherein said audio signal is produced from one of (i) a compressed audio file, (ii) a mono recording and (iii) a monaural sound.

3. The method as recited in claim 1, wherein said separating said audio signal is achieved through a phase-compensated crossover filter so that said first signal and said second signal remain synchronized in a time domain when said first signal and said second signal are recombined.

4. The method as recited in claim 3, wherein said processing said first signal further comprises modifying selectively said first signal by applying a mixture of even and odd harmonics of said low frequency components.

5. The method as recited in claim 4, wherein said processing said second signal further comprises modifying selectively said second signal by applying a mixture of even and odd harmonics of said high frequency components.

6. The method as recited in claim 1, wherein said first characteristics of said first signal enhanced by said processing said first signal include one or more of (i) a boosted bass, (ii) an optimized mix of even and odd harmonics for a smooth and rounder bass sound (iii) only-adjusted odd harmonics for sharper and more punchy bass.

7. The method as recited in claim 6, wherein said second characteristics of said second signal enhanced by said processing said second signal include one or more of (i) created harmonic series for a more intense and lively treble sound, (ii) higher clarity of treble ranges in said high frequency components, (iii) an optimized mix of even and odd harmonics for a warmer sound and (iv) only-adjusted odd harmonics for brighter treble.

8. An apparatus for enhancing the quality of an audio signal, said apparatus comprising:

a storage for said audio signal;

a bass maximizer, receiving said audio signal from said storage, enhancing low frequency components of said audio signal while delaying high frequency components of said audio signal by a first amount of time to ensure that said low and high frequency components are temporally aligned;

a harmonic exciter, coupled to said bass maximizer, enhancing said high frequency components of said audio signal while delaying said enhanced low frequency components by a second amount of time to ensure that said low and high frequency components are temporally aligned, wherein said harmonic exciter produces a processed audio signal; and a quasi stereo module having first and second sound channels, said quasi stereo module coupled to said harmonic exciter and adding a delayed and filtered version of said processed audio signal to said processed audio signal for said first sound channel and subtracting a delayed and filtered version of said processed audio signal from said processed audio signal for said second sound channel.

9. The apparatus as recited in claim 8, wherein said bass maximizer comprises:

a first phase-compensated crossover filter receiving said audio signal from said storage and separating said audio signal into a first signal having said low frequency components of said audio signal and a second signal having said high frequency components of said audio signal;

a first circuit, coupled to said first phase-compensated crossover filter and receiving said first signal therefrom, comprising an amplifier and at least a first filter to enhance said low frequency components of said first signal; and a compensation delay circuit, coupled to said first phase-compensated crossover filter, receiving and delaying said second signal by a first amount of time taken for said first circuit to process said first signal.

10. The apparatus as recited in claim 9, wherein said first filter has a distorting transfer function to provide an optimized mix of even and odd harmonics for a smoother and rounder bass.

11. The apparatus as recited in claim 9, wherein said first filter has a distorting transfer function to provide optimized odd harmonics only for a sharper and punchy bass.

12. The apparatus as recited in claim 9, wherein said first circuit further comprises a first limiter circuit coupled to said first filter and configured to maximize the volume of said first signal.

13. The apparatus as recited in claim 9, wherein said first circuit still further comprises a second order resonant high pass filter coupled to said limiter to position a resonant peak at a particular frequency and increase a bass effect of said first signal.

14. The apparatus as recited in claim 9, wherein said bass maximizer further comprises a first mixing circuit to combine processed said first signal and delayed said second signal to form a low-frequency processed audio signal.

15. The apparatus as recited in claim 14, wherein said harmonic exciter comprises a second phase-compensated crossover filter receiving said low-frequency processed audio signal and separating said low-frequency processed audio signal into a third signal having low frequency components of said low-frequency processed audio signal and a fourth signal having high frequency components of said low-frequency processed audio signal;

a second circuit, coupled to said second phase-compensated crossover filter and receiving said third signal therefrom, comprising a second amplifier and at least a second filter to enhance said high frequency components of said low-frequency processed audio signal; and a second compensation delay circuit, coupled to said second phase-compensated crossover filter, receiving and delaying said fourth signal by a second amount of time taken for said second circuit to process said third signal.

16. The apparatus as recited in claim 15, wherein said second circuit further comprises a second limiter circuit to maximize volume of said third signal so that lower amplitude high frequencies of said third signal can be contributed to an creation of new harmonic series for a more intense and lively treble enhancement.

17. The apparatus as recited in claim 16, wherein said second circuit has a distorting transfer function to provide one of (i) an optimized mix of even and odd harmonics for a warmer sound, and (ii) only-adjusted odd harmonics for brighter treble.

18. The apparatus as recited in claim 17, wherein said second circuit still comprises a pair of downsampling and upsampling circuits sandwiching said second filter, and an expander section circuit to expand original dynamics of said third signal to an enhanced treble.

19. The apparatus as recited in claim 18, wherein said harmonic exciter further comprises a second mixing circuit to combine processed said third signal and delayed said fourth signal to form a processed audio signal.

20. A computer readable medium containing program code for enhancing the quality of an audio signal, said computer readable medium comprising:

program code for separating said audio signal into a first signal having low frequency components of said audio signal and a second signal having high frequency components of said audio signal;

program code for processing said first signal, while delaying said second signal by a first amount of time taken for said program code for processing said first signal to finish, to enhance first characteristics of said first signal such that said first signal after processing can still be aligned temporally with the said delayed second signal;

and processing delayed said second signal while delaying processed said first signal by a second amount of time taken for said processing of delayed said second signal to finish, to enhance second characteristics of delayed said second signal such that delayed said second signal after processing can be aligned temporally with processed said first signal; or program code for processing said second signal, while delaying said first signal by a second amount of time taken for said program code for processing said second signal to finish, to enhance second characteristics of said second signal such that said second signal after processing can still be aligned temporally with the said delayed first signal;

and processing delayed said first signal while delaying processed said second signal by a first amount of time taken for said processing of delayed said first signal to finish, to enhance first characteristics of delayed said first signal such that delayed said first signal after processing can be aligned temporally with processed said second signal;

program code for combining processed and delayed said first signal and processed and delayed said second signal to form a processed audio signal; and program code for generating a left-channel audio signal and a right-channel audio signal from said processed audio signal, wherein said left-channel audio signal is generated by adding a delayed and filtered version of said processed audio signal to said processed audio signal, said right-channel audio signal is generated by subtracting a delayed and filtered version of said processed audio signal from said processed audio signal.

21. The computer readable medium as recited in claim 20, wherein said program code for processing said first signal further comprises program code for modifying selectively said first signal by applying a mixture of even and odd harmonics of said low frequency components.

22. The computer readable medium as recited in claim 20, wherein said program code for processing said second signal further comprises program code for modifying selectively said second signal by applying a mixture of even and odd harmonics of said high frequency components.

23. The computer readable medium as recited in claim 22, wherein said second characteristics of said second signal enhanced by said program code for processing said second signal include one or more of (i) created harmonic series for a more intense and lively treble sound, (ii) higher clarity of treble ranges in said high frequency components, (iii) an optimized mix of even and odd harmonics for a warmer sound and (iv) only-adjusted odd harmonics for a brighter treble sound.

24. The computer readable medium as recited in claim 20, wherein said first characteristics of said first signal enhanced by said program code for processing said first signal include one or more of (i) a boosted bass, (ii) an optimized mix of even and odd harmonics for a smooth and rounder bass sound (iii) only-adjusted odd harmonics for sharper and more punchy bass.

25. The computer readable medium as recited in claim 20, wherein said program code for enhancing the quality of an audio signal is executed in a processor.

26. The computer readable medium as recited in claim 20, wherein said program code for enhancing the quality of an audio signal is transportable over a data network.

* * * * *